United States Patent
Leu et al.

(10) Patent No.: US 8,160,830 B2
(45) Date of Patent: Apr. 17, 2012

(54) METHOD OF YIELD MANAGEMENT FOR SEMICONDUCTOR MANUFACTURE AND APPARATUS THEREOF

(75) Inventors: I-Yun Leu, Hsinchu (TW); Wen-Ju Yang, Hsinchu (TW); Jen-Kuei Wu, Taoyuan (TW); Yun-Yong Shen, Hsinchu (TW); Huan-Yung Chang, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 575 days.

(21) Appl. No.: 12/314,886

(22) Filed: Dec. 18, 2008

(65) Prior Publication Data

US 2009/0299669 A1  Dec. 3, 2009

(51) Int. Cl.
  *G06F 19/00* (2011.01)

(52) U.S. Cl. .................................................. 702/84

(58) Field of Classification Search ............... 702/84, 702/182–185
See application file for complete search history.

(56) References Cited

U.S. PATENT DOCUMENTS 7,962,864 B2    6/2011 Nehmadi et al.

OTHER PUBLICATIONS

Chinese Language Office Action mailed Sep. 7, 2011, in related foreign application.

*Primary Examiner* — Edward Raymond
(74) *Attorney, Agent, or Firm* — Thomas|Kayden (57) ABSTRACT

A method of yield management for semiconductor manufacture and an apparatus thereof are provided. The method includes the following steps. Defect data of a layer of a semiconductor wafer is obtained, wherein the defect data includes sizes and locations of defects with respect to the layer. A layout with respect to the layer is obtained. And a critical area analysis is performed in parallel for the layer by a plurality of processing devices according to the defect data and the layout to determine locations of defects falling into a critical area of the layer among the locations of the defects.

20 Claims, 6 Drawing Sheets

METHOD OF YIELD MANAGEMENT FOR SEMICONDUCTOR MANUFACTURE AND APPARATUS THEREOF

FIELD OF INVENTION

The present invention relates to the yield management for semiconductor manufacture, and more particularly to the real time yield management for semiconductor manufacture.

BACKGROUND OF THE INVENTION

The manufacture of semiconductor-integrated chips is complicated. Layers and layers of materials are formed on the substrate to fabricate a wafer, which is to be diced into hundreds of dies and be packaged as chips. During the fabrication of the wafers, defects due to operational errors, equipment malfunctions, or the environmental uncertainty may occur in different layers of the wafer. The defects may cause bad dies in the finished wafers, and thus the yield of manufacture is reduced. To manage the yield more effectively, it is desirable to find out the defects and their origins as thoroughly and soon as possible.

Defect scan tools are commonly utilized to collect the defect data of each layer of the wafer. However, the typical defect data may only include sizes and locations of defects with respect to that layer. When the center of a given-size defect resides in a critical area, it will be found to result in a fault, e.g., a circuit short or a circuit open. Thus to determine whether a defect will causes a fault, a wafer is usually be inspected by the human eye to see if that defect falls into that critical area. And a yield map that indicates locations of defects falling into the critical area is obtained with respect to that scanned layer.

Nevertheless, the quantity of wafers manufactured everyday is too large to inspect each of them. Thus only some sampled wafers would be inspected while being manufactured, and certain problems causing defects may not be found immediately if the defected wafers are not chosen to inspect.

For each wafer, the wafer map that indicates locations of bad dies will not be obtained until probing performed at the end of the manufacture of the entire lot of wafers, where the a bad die is referred to a die having at least one fault. Then the problems causing low yield may not be recognized until this moment, and thus the cost is enormously raised.

To find out the defects and their origins as thoroughly and soon as possible, it is desirable to have a method and an apparatus thereof capable of, during the fabrication of a lot of wafers, producing the yield map of each layer and the wafer map of every wafer. Then the yield could be managed in real-time.

SUMMARY OF THE INVENTION

One aspect of the present invention is to find out the defects and their origins as thoroughly and soon as possible, and thus to manage the yield of semiconductor manufacture in real time.

Another aspect of the present invention is to provide a method of yield management for semiconductor manufacture. The method includes the following steps. Defect data of a layer of a semiconductor wafer is obtained, wherein the defect data includes sizes and locations of defects with respect to the layer. A layout with respect to the layer is obtained. And a critical area analysis is parallelly performed for the layer by a plurality of processing devices according to the defect data and the layout to determine locations of defects falling into a critical area of the layer among the locations of the defects.

The method mentioned above may further include the following steps before the step of obtaining the defect data. The defect data of each layer of the semiconductor wafer are collected. The defect data of each layer of another semiconductor wafer under the same semiconductor process as the semiconductor wafer are collected. The defect data of the each layer of the semiconductor wafer and the defect data of the each layer of that another semiconductor wafer are prioritized according to defect counts, layer attributes or a combination thereof. The step of obtaining the defect data above may be executed as for the defect data having the highest priority.

The method mentioned above may further include the following step after the step of performing the critical area analysis. The equipment with respect to the layer is adjusted if the number of the locations of defects falling into the critical area of the layer is larger than a threshold.

The defect data mentioned above may be obtained from a defect scan apparatus, a defect data database, or a combination thereof, wherein the defect data database includes defect data of the layer of a previously manufactured semiconductor wafer. The layout may be a layout being implemented, a layout scaled from a previously implemented layout, a layout under design, or a combination thereof.

The method mentioned above may further include the following steps. The step of obtaining the defect data, the step of obtaining the layout and the step of performing the critical area analysis are executed for other layers of the semiconductor wafer. The locations of defects falling into the critical areas of the layers are combined to determine locations of the bad dies of the semiconductor wafer. Besides, a yield of another semiconductor wafer may be predicted according to the determined locations of the bad dies of the semiconductor wafer. The equipment with respect to the semiconductor wafers may be adjusted according to the yield.

Furthermore, the semiconductor wafer may be probed to generate a probed wafer map of the semiconductor wafer in order to identify real locations of the bad dies. The determined locations of the bad dies may be matched with real locations of the bad dies to find a correct rate. If the correct rate is higher than about 99%, the method may further include the following steps. The step of obtaining the defect data, the step of obtaining the layout and the step of performing the critical area analysis are executed for layers of another semiconductor wafer. The locations of defects falling into the critical areas of the layers of that another semiconductor wafer are combined to determine locations of the bad dies of that another semiconductor. The estimated locations of the bad dies are ignored while probing that another semiconductor wafer.

Still another aspect of the present invention is to provide an apparatus of yield management for semiconductor manufacture. The apparatus includes a defect data module for obtaining defect data of a layer of a semiconductor wafer, a layout module for obtaining a layout with respect to the layer, and a plurality of processing devices. The defect data includes sizes and locations of defects with respect to the layer. The plurality of processing devices are provided for performing in parallel a critical area analysis for the layer according to the defect data and the layout to determine locations of defects falling into a critical area of the layer among the locations of the defects.

The apparatus mentioned above may further include a first data collector for collecting the defect data of each layer of the semiconductor wafer, a second data collector for collecting defect data of each layer of another semiconductor wafer under the same semiconductor process, and a prioritizing module. The prioritizing module is provided for prioritizing the defect data of the each layer of the semiconductor wafer and the defect data of the each layer of that another semiconductor wafer according to defect counts, layer attributes or a combination thereof. The defect data module may execute for a defect data having the highest priority.

The apparatus mentioned above may further include an adjusting module for adjusting the equipment with respect to the layer if the number of the locations of defects falling into the critical area of the layer is larger than a threshold.

The defect data mentioned above may be obtained from a defect scan apparatus, a defect data database, or a combination thereof, wherein the defect data database includes defect data of the layer of a previously manufactured semiconductor wafer. The layout may be a layout being implemented, a layout scaled from a previously implemented layout, a layout under design, or a combination thereof.

The apparatus mentioned above may further include a requesting module and a combining module. The requesting module requests the defect data module, the layout module and the plurality of processing devices to execute as for other layers of the semiconductor wafer. The combining module combines the locations of defects falling into the critical areas of the layers to determine locations of the bad dies of the semiconductor wafer. Besides, the apparatus may further include a predicting module for predicting a yield of another semiconductor wafer according to the determined locations of the bad dies of the semiconductor wafer. The apparatus may further include an adjusting module for adjusting the equipment with respect to the semiconductor wafers according to the yield.

Furthermore, the apparatus mentioned above may further include a probing module and a matching module. The probing module probes the semiconductor wafer in order to identify real locations of the bad dies. The matching module matches the determined locations of the bad dies with the real locations of the bad dies to find a correct rate. The apparatus may further include a requesting module for requesting the defect data module, the layout module and the plurality of processing devices to execute for layers of another semiconductor wafer. The apparatus may further include a combining module for combining the locations of defects falling into the critical areas of the layers of that another semiconductor wafer to determine locations of the bad dies. The apparatus may further include an ignoring module for ignoring the determined locations of the bad dies while probing that another semiconductor wafer.

The foregoing and other features of the invention will be apparent from the following more particular description of embodiment of the invention.

DETAILED DESCRIPTION OF THE PREFERRED EMBODIMENTS

In contrast to the prior art, the defect data and the layout of every layer of every wafer are integrated into the critical area analysis and analyzed in real time in the present invention. Checking by automatic devices instead of human eyes, all the layers of wafers could be analyzed during the manufacture. Thus the defects and their origins could be found out as thoroughly and soon as possible. The yield maps indicating locations of defects falling into the critical area as well we the wafer maps indicating locations of the bad dies are also generated in real time. Thus the yield could be accurately predicted in real time. Besides, the critical area analysis may be performed in parallel by a plurality of processing devices, and then the yield map can be generated more efficiently.

Figure 1:
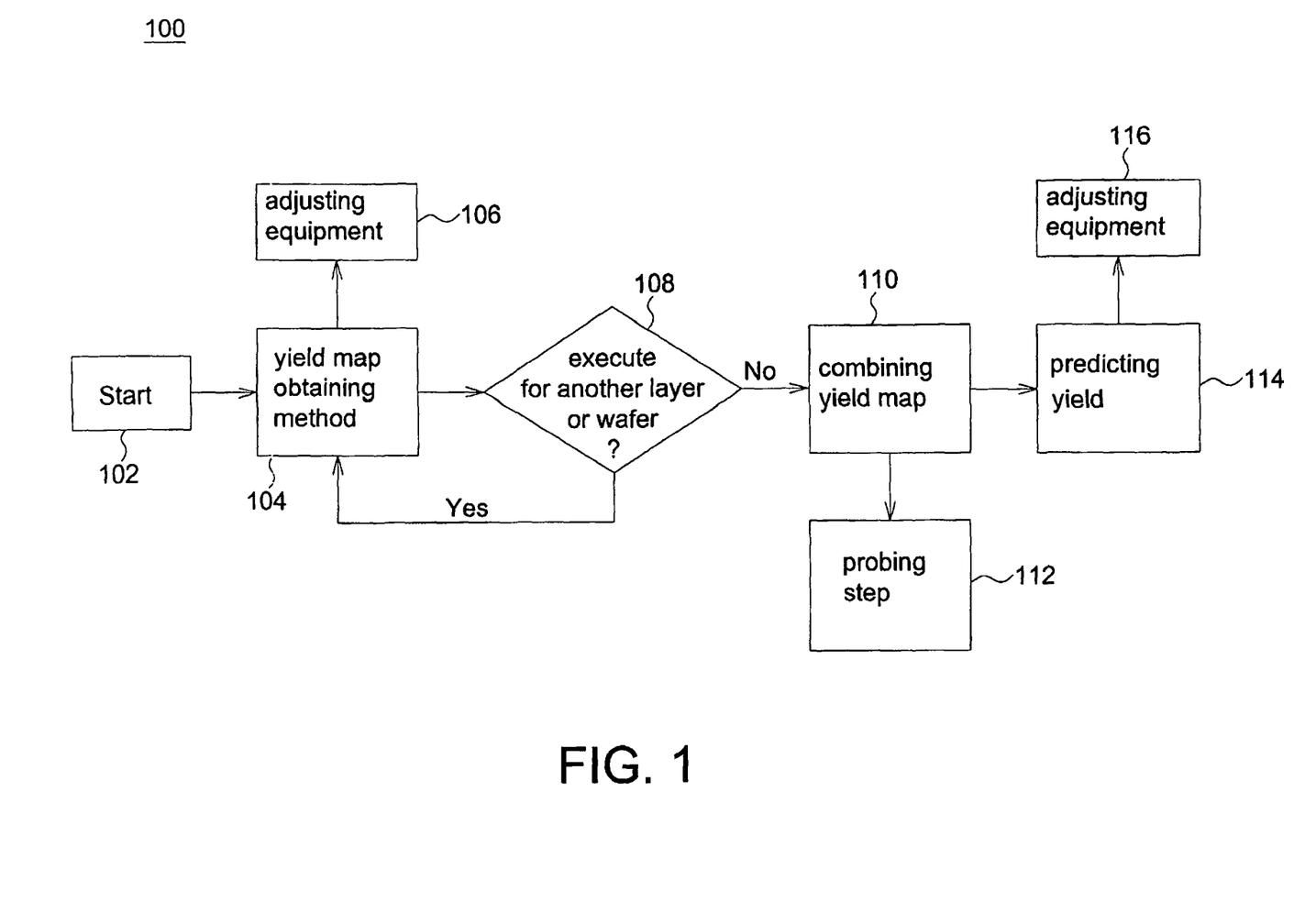
FIG. 1 depicts a flow chart of one embodiment of the method of yield management for semiconductor manufacture according to the present invention.

Referring to FIG. 1, a flow chart of the method 100 according to one embodiment is depicted. The method 100 starts at step 102. The yield map that indicates, among the locations of the defects, locations of defects falling into the critical area is obtained with respect to a layer of a semiconductor wafer in step 104, where the layers of a semiconductor wafer may include materials like OD, PO, CO, Ml, Mx, Viax, etc.

The yield map may be interpreted to analyze the origins of the defects and be provided for the process improvement. For example, if the number of the locations of defects falling into the critical area is larger than a threshold, or the spatial distribution of those defects has certain patterns, the equipment with respect to the layer may need adjusting as shown in step 106. The equipment with respect to the layer may include the equipment for fabricating the layer. Then a defect fix summary may be generated.

Next a decision whether the yield map generating step is required for another layer or another wafer is made at step 108. If the yield map for another layer or another wafer is preferred, the method 100 adopts the step 104 for another layer or another wafer. If it is not necessary to repeat the step 104, the method 100 proceeds to step 110 to combine the yield maps of several layers to generate an estimated wafer map of the semiconductor wafer, wherein the estimated wafer map indicates, at least, estimated locations of the bad dies.

The estimated wafer map will help improving the efficiency of the probing step 112 described later. The yield of the semiconductor wafer could be predicted in real time according to the estimated wafer map. The wafer map and the yield may be stored in a database for analysis later. Furthermore, a yield of another semiconductor wafer may be predicted according to the estimated wafer map of the previous semiconductor wafer in step 114. For instance, if the bad dies on the estimated wafer map of a semiconductor wafer show certain patterns, which could be related to a particular manufacturing problem, the next semiconductor wafer under the same process may have a similar wafer map and thus a yield close to that of its precedent.

Additionally, the equipment with respect to the semiconductor wafers may be adjusted according to the yield in step 116. The equipment with respect to the semiconductor wafers may include the equipment for manufacturing the semiconductor wafers or any other equipment related to the manufacturing process of the semiconductor wafers. For example, the manufacturer could know the yield of the whole lot of wafers based on the yield predicted in real time in step 114, and compare it with the order from the customer. If there is excess, the equipment could be adjusted to have a lower throughput; if there is a shortage, the equipment could be adjusted to have a higher throughput. Therefore the inventory could be controlled efficiently and the cost could be further down.

Figure 2:
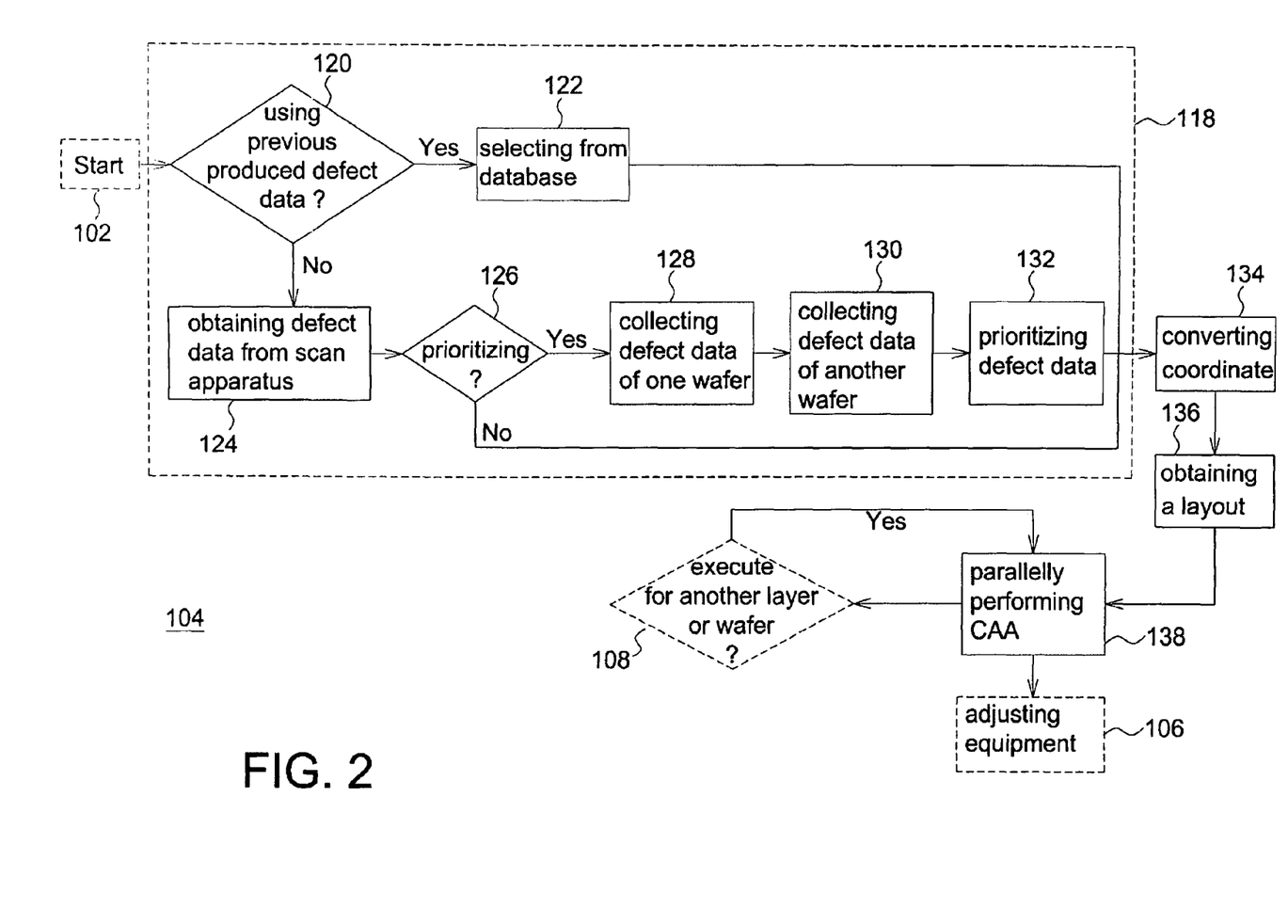
FIG. 2 depicts a flow chart of one embodiment of the yield map generating step in FIG. 1.

Referring to FIG. 2, a flow chart of one embodiment of the yield map generating step 104 in FIG. 1 is further depicted. A defect data of a layer of a semiconductor wafer is obtained in step 118, wherein the defect data includes sizes and locations of defects with respect to the layer. The defect data of that layer may be obtained from a defect scan apparatus, by a defect data database, or by a combination thereof, wherein the defect data database includes defect data of the layer of a previously manufactured semiconductor wafer. The defect scan apparatus may include apparatuses developed by KLA Instruments Corporation. If a decision of using a previous defect data is made in step 120, the defect data may be selected from the defect data database in step 122. Otherwise, the defect data may be obtained from the defect scan apparatus in step 124.

The defect scan apparatus generally generates thousands of defect data daily, which may be analyzed sequentially or based on the priority. If a decision of prioritizing the defect data is made in step 126, the method proceeds to collect the defect data of each layer of the semiconductor wafer in step 128. And the defect data of each layer of another semiconductor wafer under the same semiconductor process are collected in step 130.

The defect data of the each layer of the semiconductor wafer and the defect data of the each layer of that another semiconductor wafer are prioritized according to defect counts, layer attributes or a combination thereof in step 132. For example, a defect data having a larger defect count could be given a higher priority. The defect data of a certain layer of different wafers show increasing defect counts could be given a higher priority, or the defect data of a critical layer could be given a higher priority, or the defect data of layers of wafers attributed to an important product could be given a higher priority. In other words, the defect data could be prioritized based on any practical factors. And a defect data of a layer of a semiconductor wafer having the highest priority may be analyzed in the following steps.

Next, the coordinate of the defect data in step 118 may be converted to fit in with the coordinate system of the layout plotted in step 134. And a layout with respect to the layer is obtained in step 136. The layout may be a layout being implemented, a layout scaled from a previously implemented layout, a layout under design, or a combination thereof.

To generate the yield data of the wafers being manufactured in real time, the defect data obtained from the defect scan apparatus may be analyzed based on the layout being implemented. To obtain an estimated yield data of a new process or equipment, the defect data of the layers of the wafers manufactured by the new process or equipment obtained from the defect scan apparatus may be analyzed based on a layout scaled from a previously implemented layout. Then the new process or equipment resulting in key failures could be improved quickly, the layout sensitivity to the new process or equipment could be identified earlier, and the yield ramp could be speeded up.

To estimate a potential yield of a layout under design, the defect data of layers of previously manufactured wafers obtained from the defect data database may be utilized to work with the layout under design in the analysis. The layout design may be improved even before a real manufacture, and thus the cost could be down effectively.

It should be noted that the sequence of the method 118, the step 134 and the step 136 is not limited to FIG. 2. Besides, the coordinate of the layout that to be converted to fit in with the coordinate system of the defect data in step 118 is plotted in step 134. In other words, a same coordinate system for defect data and a layout is preferred, but the sequence and the coordinate system in which they are gotten are not that important to proceed to step 138.

In step 138, a critical area analysis is performed in parallel for the layer by a plurality of processing devices according to the defect data and the layout to generate a yield map of the layer, wherein the yield map indicates, among the locations of the defects, locations of defects falling into a critical area of the layer. In other words, locations of defects falling into a critical area of the layer are determined in this step. The efficiency of the yield map production could be raised because the critical area analysis may be performed parallelly by the plurality of processing devices. The method 118, the step 134, the step 136, and the step 138 may be executed for other layers of the semiconductor wafer or layers of another wafer.

Figure 3:
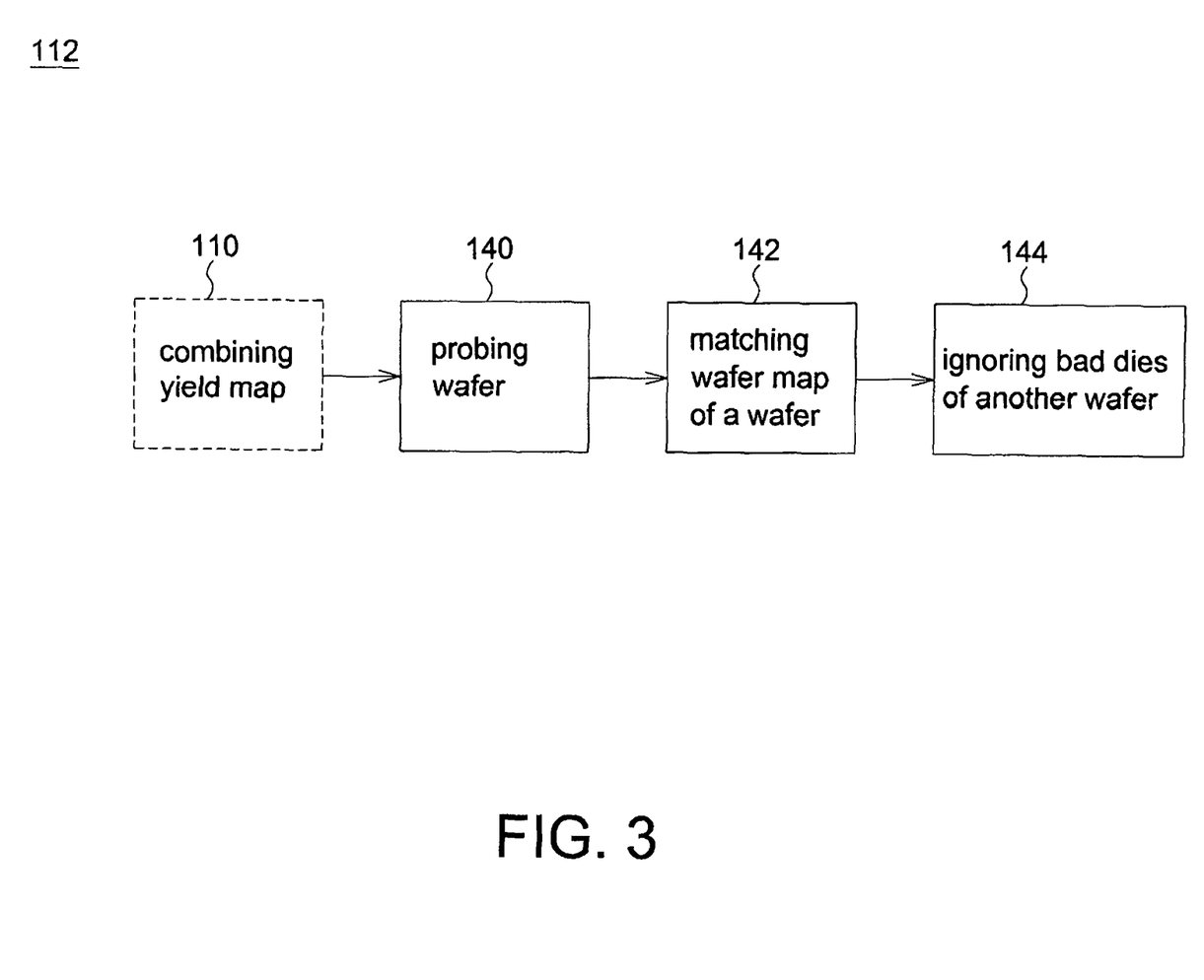
FIG. 3 depicts a flow chart of one embodiment of the probing step in FIG. 1.

Referring to FIG. 3, a flow chart of one embodiment of the probing method 112 in FIG. 1 is depicted. After an estimated wafer map of the semiconductor wafer is generated in step 110, the semiconductor wafer may be probed to generate a probed wafer map of the semiconductor wafer in step 140, wherein the probed wafer map indicates real locations of the bad dies. In other words, real locations of the bad dies are identified in this step. The estimated wafer map with determined locations of the bad dies is matched with the probed wafer map with real locations of the bad dies, to find a correct rate in step 142. In one embodiment, the correct rate is a ratio of the number of dies rightly estimated (truly good dies and truly bad dies) to the total number of dies of a wafer. If the correct rate is higher than, for example, about 99%, the method 104 and the step 110 may be executed for another semiconductor wafer to generate an estimated wafer map of that another semiconductor wafer. Again, the estimated wafer map of that another semiconductor wafer indicates estimated/determined locations of the bad dies of that another semiconductor wafer. And the estimated locations of the bad dies of that another semiconductor wafer may be ignored while probing that another semiconductor wafer as step 144. The test time and cost of finished wafers could be reduced accordingly.

Figure 4:
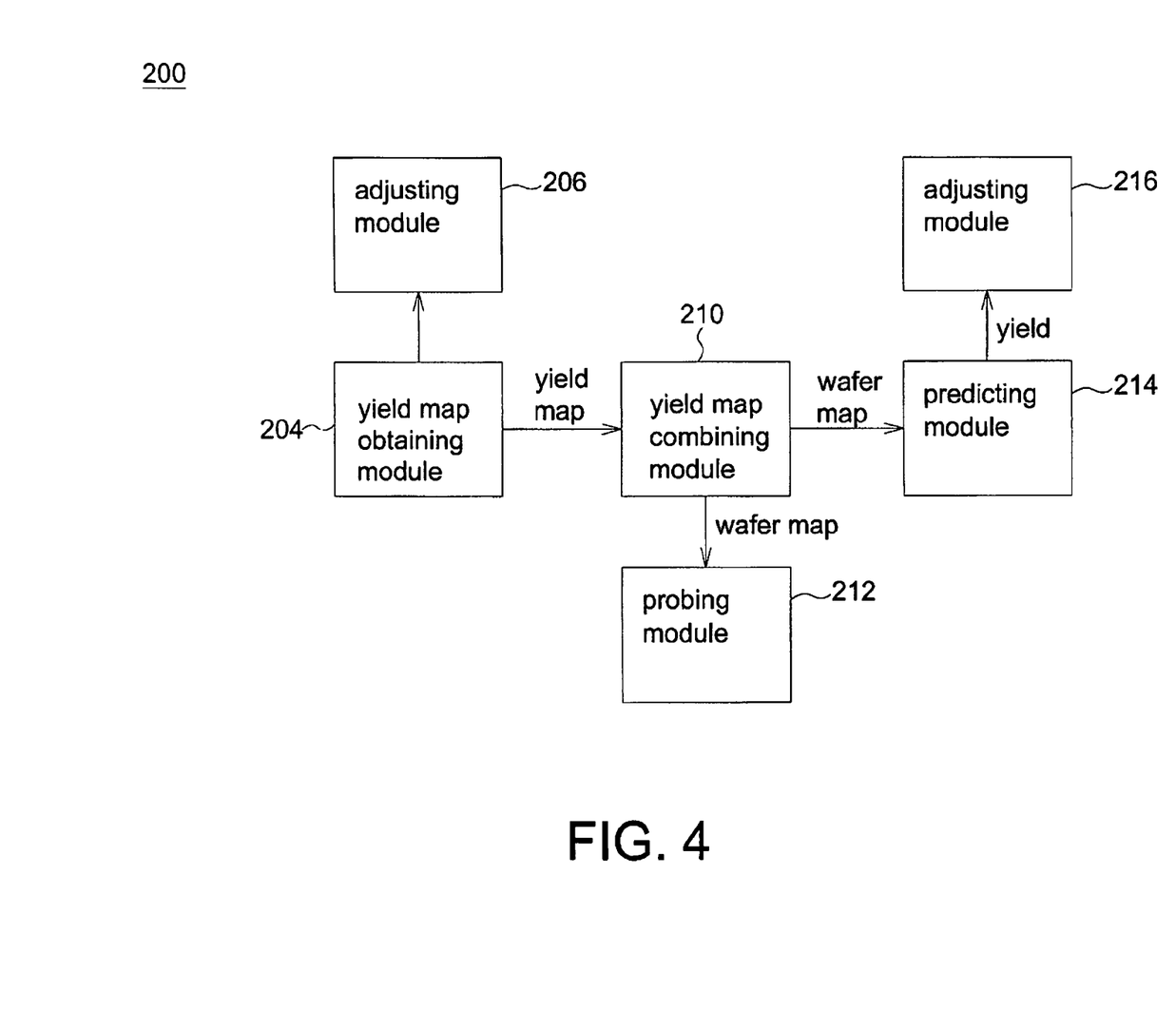
FIG. 4 depicts a block diagram of one embodiment of the apparatus of yield management for semiconductor manufacture according to the present invention.
Figure 5:
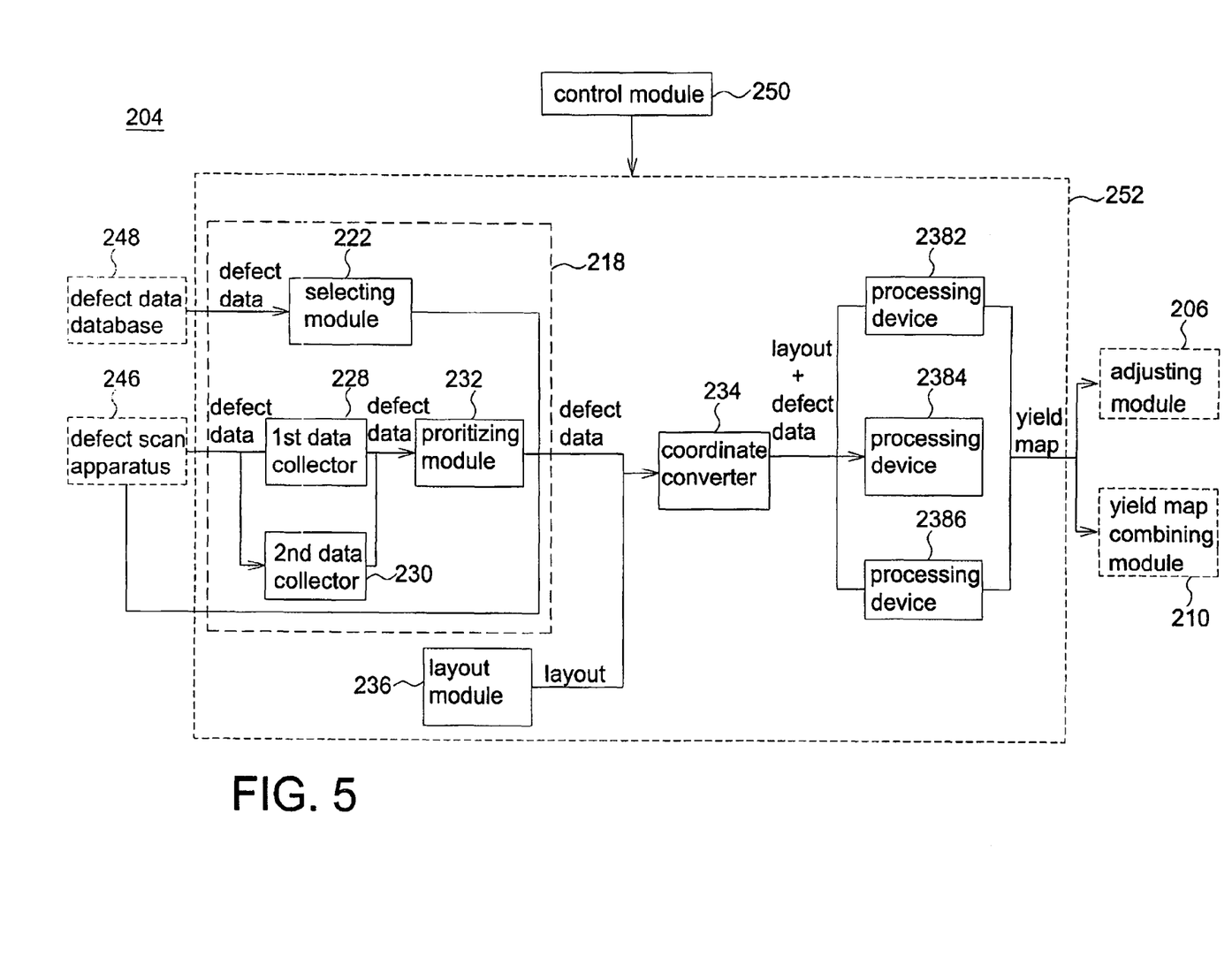
FIG. 5 depicts a block diagram of one embodiment of the yield map obtaining module in FIG. 4.
Figure 6:
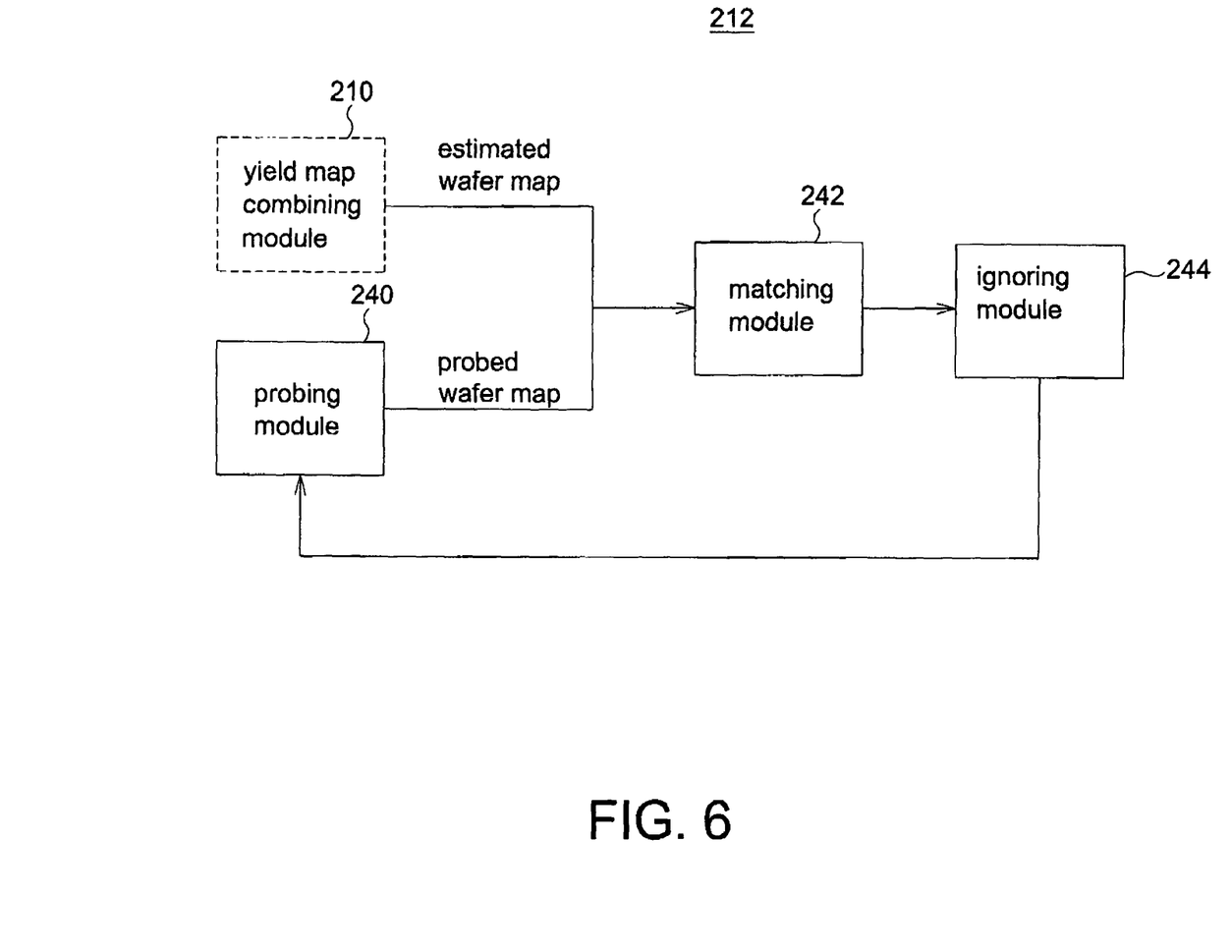
FIG. 6 depicts a block diagram of the probing module in FIG. 4.

Now referring to FIGS. 4-6, block diagrams of one embodiment of the apparatus 200 of yield management for semiconductor manufacture according to the present invention are depicted. The apparatus 200 is provided for performing the method 100 described in conjunction with FIGS. 1-3. The module 204 generates the yield map that indicates, among the locations of the defects, locations of defects falling into the critical area is obtained with respect to a layer of a semiconductor wafer. The yield map may be interpreted by the adjusting module 206 to analyze the origins of the defects and be provided for the process improvement. For example, if the number of the locations of defects falling into the critical area is larger than a threshold, or the spatial distribution of those defects has certain pattern, the equipment with respect to the layer may need adjusting. Then a defect fix summary may be generated.

The yield maps of the layers may be combined by the yield map combining module 210 to generate an estimated wafer map of the semiconductor wafer, wherein the estimated wafer map indicates estimated/determined locations of the bad dies.

The estimated wafer map helps improving the efficiency of the probing module 212. Furthermore, a yield of another semiconductor wafer may be predicted according to the estimated wafer map of the previous semiconductor wafer by the predicting module 214. For instance, if the bad dies on the estimated wafer map of a semiconductor wafer show certain patterns, which could be related to a particular problem, the next semiconductor wafer under the same process may have a similar wafer map and thus a yield close to that of that of its precedent.

The adjusting module 216 may adjust equipment with respect to the semiconductor wafers. The equipment with respect to the semiconductor wafers may include the equipment manufacturing the semiconductor wafers or any other equipment related to the manufacturing process of the semiconductor wafers. For example, the manufacturer could easily know the yield of the entire lot of wafers based on the yield predicted in real time by the predicting module 214, and compare it with the order from the customer.

FIG. 5 depicts a block diagram of one embodiment of the yield map obtaining module 204 in FIG. 4. Defect data of a layer of a semiconductor wafer is obtained by the module 218, wherein the defect data includes sizes and locations of defects with respect to the layer. The defect data of that layer may be obtained from a defect scan apparatus 246, a defect data database 248, or a combination thereof, wherein the defect data database 248 includes defect data of the layer of a previously manufactured semiconductor wafer. If the control module 250 decides to use a previous defect data, the defect data may be selected from the defect data database by the selecting module 222. Otherwise, the defect data may be obtained from the defect scan apparatus 246.

The defect scan apparatus 246 generally generates thousands of defect data daily, which may be analyzed sequentially or based on the priority. If the control module 250 decides to prioritize the defect data, the data collector 228 collects the defect data of each layer of the semiconductor wafer. And the defect data of each layer of another semiconductor wafer under the same semiconductor process are collected by the data collector 230. The defect data of the each layer of the semiconductor wafer and the defect data of the each layer of that another semiconductor wafer are prioritized according to defect counts, layer attributes or a combination thereof by the prioritizing module 232. And defect data of a layer of a semiconductor wafer which has the highest priority may be analyzed as mentioned below.

A layout with respect to the layer is obtained by the layout module 236. The layout may be a layout being implemented, a layout scaled from a previously implemented layout, a layout under design, or a combination thereof.

To generate the yield data of the wafers being manufactured in real time, the defect data obtained from the defect scan apparatus may be analyzed based on the layout being implemented. To obtain an estimated yield data of a new process or equipment, the defect data of the layers of the wafers manufactured by the new process or equipment obtained from the defect scan apparatus may be analyzed based on a layout scaled from a previously implemented layout. Then the new process or equipment resulting in key failures could be improved quickly, the layout sensitivity to the new process or equipment could be identified earlier, and the yield ramp could be speeded up.

To estimate a potential yield of a layout under design, the defect data of layers of previously manufactured wafers obtained from the defect data database is utilized to work with the layout under design in the analysis. The layout design may be improved even before a real manufacture, and thus the cost could be down effectively.

Next, the coordinate of the defect data obtained by the module 218 may be converted by the coordinate converter 234 to fit in with the coordinate system of the plotted layout. Or the coordinate of the layout that to be converted by the coordinate converter 234 to fit in with the coordinate system of the defect data obtained by the module 218 is plotted. And a critical area analysis may be performed in parallel for the layer by a plurality of processing devices 2382-2384 according to the defect data and the layout to generate a yield map of the layer. The yield map indicates among the locations of the defects, locations of defects falling into a critical area of the layer. In other words, locations of defects falling into a critical area of the layer are determined here. The efficiency of the yield map production could be raised because the critical area analysis may be performed parallelly by the plurality of processing devices 2382-2384. It should be noted that the number of the processing devices should be set based on practical requirements, but not limited to this embodiment 200. The control module 250 may request the module 252 to execute for other layers of the semiconductor wafer or layers of another wafer.

Referring to FIG. 6, a block diagram of one embodiment of the probing module 212 in FIG. 4 is depicted. The yield map combining module 210 may generate an estimated wafer map of the semiconductor wafer. The semiconductor wafer may be probed by the probing module 240 to generate a probed wafer map, wherein the probed wafer map indicates real locations of the bad dies. In other words, real locations of the bad dies are identified here. The estimated wafer map with determined locations of the bad dies is matched with the probed wafer map with real locations of the bad dies, to find a correct rate by the matching module 242. If the correct rate is higher than, for example, about 99%, the module 204 and the module 210 may execute for another semiconductor wafer to generate an estimated wafer map of that another semiconductor wafer. Again, the estimated wafer map of that another semiconductor wafer indicates estimated/determined locations of the bad dies of that another semiconductor wafer. And the ignoring module 244 requests for ignoring the estimated locations of the bad dies of that another semiconductor wafer while the probing module 240 probes that another semiconductor wafer.

While this invention has been described with reference to the illustrative embodiments, these descriptions should not be construed in a limiting sense. Various modifications of the illustrative embodiment, as well as other embodiments of the invention, will be apparent upon reference to these descriptions. It is therefore contemplated that the appended claims will cover any such modifications or embodiments as falling within the real scope of the invention and its legal equivalents.

We claim:

1. A method of yield management for semiconductor manufacture, comprising: obtaining defect data of a layer of a semiconductor wafer, wherein the defect data includes sizes and locations of defects with respect to the layer; obtaining a layout with respect to the layer; and performing in parallel in real-time, by a plurality of processing devices, a critical area analysis for the layer according to the defect data and the layout, in order to determine, among the locations of the defects, locations of defects falling into a critical area of the layer.

2. The method according to claim 1, further comprising the following steps prior to the step of obtaining the defect data:
collecting the defect data of each layer of the semiconductor wafer;
collecting defect data of each layer of another semiconductor wafer under the same semiconductor process as the semiconductor wafer; and
prioritizing the defect data of the each layer of the semiconductor wafer and the defect data of the each layer of that another semiconductor wafer according to defect counts, layer attributes or a combination thereof;

wherein the step of obtaining the defect data is executed as for the defect data having the highest priority.

3. The method according to claim 1, further comprising the following step after the step of performing the critical area analysis:

adjusting equipment with respect to the layer if the number of the locations of defects falling into the critical area of the layer is larger than a threshold.

4. The method according to claim 1, wherein the defect data is obtained from a defect scan apparatus, a defect data database, or a combination thereof; wherein the defect data database includes defect data of the layer of a previously manufactured semiconductor wafer.

5. The method according to claim 1, wherein the layout is a layout being implemented, a layout scaled from a previously implemented layout, a layout under design, or a combination thereof.

6. The method according to claim 1, further comprising:
executing, for other layers of the semiconductor wafer, the step of obtaining the defect data, the step of obtaining the layout, and the step of performing the critical area analysis; and
combining the locations of defects falling into the critical areas of the layers to determine locations of the bad dies of the semiconductor wafer.

7. The method according to claim 6, further comprising:
predicting a yield of another semiconductor wafer according to the locations of the bad dies of the semiconductor wafer.

8. The method according to claim 7, further comprising:
adjusting equipment with respect to the semiconductor wafers according to the yield.

9. The method according to claim 6, further comprising:
probing the semiconductor wafer in order to identify real locations of the bad dies; and
matching the determined locations of the bad dies with the real locations of the bad dies to find a correct rate.

10. The method according to claim 9, wherein if the correct rate is higher than about 99%, the method further comprises:
executing, for layers of another semiconductor wafer, the step of obtaining the defect data, the step of obtaining the layout and the step of performing the critical area analysis;
combining the locations of defects falling into the critical areas of the layers of that another semiconductor wafer to determine locations of the bad dies of that another semiconductor wafer; and
ignoring the determined locations of the bad dies while probing that another semiconductor wafer.

11. An apparatus of yield management for semiconductor manufacture, comprising: a defect data module for obtaining a defect data of a layer of a semiconductor wafer, wherein the defect data includes sizes and locations of defects with respect to the layer; a layout module for obtaining a layout with respect to the layer; and a plurality of processing devices for performing in parallel in real-time a critical area analysis for the layer according to the defect data and the layout to determine, among the locations of the defects, locations of defects falling into a critical area of the layer.

12. The apparatus according to claim 11, further comprises:
a first data collector for collecting the defect data of each layer of the semiconductor wafer;
a second data collector for collecting defect data of each layer of another semiconductor wafer under the same semiconductor process as the semiconductor wafer; and
a prioritizing module for prioritizing the defect data of the each layer of the semiconductor wafer and the defect data of the each layer of that another semiconductor wafer according to defect counts, layer attributes or a combination thereof;
wherein the defect data module executes as for the defect data having the highest priority.

13. The apparatus according to claim 11, further comprising:
an adjusting module for adjusting equipment with respect to the layer if the number of the locations of defects falling into the critical area of the layer is larger than a threshold.

14. The apparatus according to claim 11, wherein the defect data is obtained from a defect scan apparatus, a defect data database, or a combination thereof; wherein the defect data database includes defect data of the layer of a previously manufactured semiconductor wafer.

15. The apparatus according to claim 11, wherein the layout is a layout being implemented, a layout scaled from a previously implemented layout, a layout under design, or a combination thereof.

16. The apparatus according to claim 11, further comprising:
a requesting module for requesting the defect data module, the layout module and the plurality of processing devices to execute as for other layers of the semiconductor wafer; and
a combining module for combining the locations of defects falling into the critical areas of the layers to determine locations of the bad dies of the semiconductor wafer.

17. The apparatus according to claim 16, further comprising:
a predicting module for predicting a yield of another semiconductor wafer according to the determined locations of the bad dies of the semiconductor wafer.

18. The apparatus according to claim 17, further comprising:
an adjusting module for adjusting equipment with respect to the semiconductor wafers according to the yield.

19. The apparatus according to claim 16, further comprising:
a probing module for probing the semiconductor wafer in order to identify real locations of the bad dies; and
a matching module for matching the determined locations of the bad dies with the real locations of the bad dies to find a correct rate.

20. The apparatus according to claim 19, further comprises:
a requesting module for requesting the defect data module, the layout module and the plurality of processing devices to execute for layers of another semiconductor wafer;
a combining module for combining the locations of defects falling into the critical areas of the layers of that another semiconductor wafer to determine locations of the bad dies of that another semiconductor wafer; and
an ignoring module for ignoring the determined locations of the bad dies while probing that another semiconductor wafer.

* * * * *